(12) United States Patent
Mouli

(10) Patent No.: US 8,723,235 B2
(45) Date of Patent: May 13, 2014

(54) JFET DEVICES WITH INCREASED BARRIER HEIGHT AND METHODS OF MAKING THE SAME

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/400,442

(22) Filed: Feb. 20, 2012

(65) Prior Publication Data

US 2012/0146049 A1 Jun. 14, 2012

Related U.S. Application Data

(62) Division of application No. 12/179,299, filed on Jul. 24, 2008, now Pat. No. 8,120,072.

(51) Int. Cl.
*H01L 29/812* (2006.01)

(52) U.S. Cl.
USPC ............. 257/280; 257/77; 257/902; 257/903; 257/134; 257/E29.315; 257/E29.317; 257/E29.346

(58) Field of Classification Search
USPC ............ 257/123, 77, 280, E29.315, E29.317, 257/E21.45; 438/186
See application file for complete search history.

(56) References Cited

U.S. PATENT DOCUMENTS

| | | | |
|---|---|---|---|
| 3,912,546 A * | 10/1975 | Hunsperger et al. ......... | 438/174 |
| 4,612,629 A | 9/1986 | Harari | |
| 4,679,298 A | 7/1987 | Zuleeg et al. | |
| 5,243,209 A | 9/1993 | Ishii | |
| 5,321,283 A | 6/1994 | Cogan et al. | |
| 5,357,127 A | 10/1994 | Park et al. | |
| 5,378,642 A | 1/1995 | Brown et al. | |
| 5,393,998 A | 2/1995 | Ishii et al. | |

(Continued)

FOREIGN PATENT DOCUMENTS

| JP | 5129559 | 5/1993 |
|---|---|---|
| WO | WO8808617 | 11/1988 |

OTHER PUBLICATIONS

U.S. Appl. No. 12/179,330, filed Jul. 24, 2008; Applicant: Chandra Mouli; Entitled: JFET Devices with PIN Gate Stacks and Methods of Making Same.

(Continued)

*Primary Examiner* — Marc Armand
(74) *Attorney, Agent, or Firm* — Fletcher Yoder, P.C.

(57) ABSTRACT

Devices and methods for providing JFET transistors with improved operating characteristics are provided. Specifically, one or more embodiments of the present invention relate to JFET transistors with a higher diode turn-on voltage. For example, one or more embodiments include a JFET with a doped silicon-carbide gate, while other embodiments include a JFET with a metal gate. One or more embodiments also relate to systems and devices in which the improved JFET may be employed, as well as methods of manufacturing the improved JFET.

17 Claims, 6 Drawing Sheets

(56) References Cited

U.S. PATENT DOCUMENTS

| | | |
|---|---|---|
| 6,174,763 B1 | 1/2001 | Beilstein et al. |
| 6,271,550 B1 | 8/2001 | Gehrmann |
| 6,307,245 B1 | 10/2001 | Kunii et al. |
| 6,310,378 B1 | 10/2001 | Letavic et al. |
| 6,313,489 B1 | 11/2001 | Letavic et al. |
| 6,316,297 B1 | 11/2001 | Matsuda |
| 6,404,015 B2 | 6/2002 | Emmerik et al. |
| 6,503,782 B2 | 1/2003 | Casady et al. |
| 6,767,783 B2 | 7/2004 | Casady et al. |
| 6,936,866 B2 | 8/2005 | Deboy et al. |
| 7,049,196 B2 | 5/2006 | Noble |
| 7,122,411 B2 | 10/2006 | Mouli |
| 7,199,442 B2 | 4/2007 | Shenoy |
| 7,202,528 B2 | 4/2007 | Sankin et al. |
| 7,288,821 B2 | 10/2007 | Kwon |
| 7,294,860 B2 | 11/2007 | Mazzola et al. |
| 7,638,401 B2 | 12/2009 | Nagata |
| 2004/0018673 A1 | 1/2004 | Tsai et al. |
| 2004/0078673 A1 | 4/2004 | Decker |
| 2004/0183080 A1* | 9/2004 | Kusumoto et al. ............ 257/77 |
| 2004/0256633 A1* | 12/2004 | Thornton ..................... 257/123 |
| 2005/0001218 A1* | 1/2005 | Hackler et al. ................. 257/78 |
| 2006/0043379 A1 | 3/2006 | Zhang et al. |
| 2006/0046355 A1 | 3/2006 | Parekh et al. |
| 2006/0118858 A1 | 6/2006 | Jeon et al. |
| 2006/0197129 A1 | 9/2006 | Wohlmuth |
| 2007/0096144 A1 | 5/2007 | Kapoor et al. |
| 2007/0126478 A1 | 6/2007 | Kapoor |
| 2007/0228485 A1 | 10/2007 | Tsuchiya et al. |
| 2008/0280405 A1 | 11/2008 | Tsuchiya et al. |

OTHER PUBLICATIONS

U.S. Appl. No. 12/333,012, filed Dec. 11, 2008; Applicant: Chandra Mouli; Entitled: JFET Device Structures and Methods for Fabricating the Same.

U.S. Appl. No. 12/333,067, filed Dec. 11, 2008; Applicant: Chandra Mouli; Entitled: Low Power Memory Device with JFET Device Structures.

Dungan, T.E. et al.; One-Transistor GaAs MESFET and JFET Accessed Dynamic RAM Cells for High-Speed Medium Density Applications; IEEE Transportation on Electronic Devices; Jul. 19990, vol. 37, pp. 1599-1607.

Waldrop, J.R.; Schottky Barrier Height of Metal Contacts to P-Type Alpha 6H-SiC; J. Appl. Phys. 75 (9) 1994.

Mitleher et al.; Switching Behaviour of Fash High Voltage SiC pn—Diodes; Proceedings of 1998 International Symposium on Power Semiconductor Devices and ICs, Kyoto, pp. 127-130.

Round, S. et al.; A SiC JFET Driver for a 5 Kw, 150 KhZ Three-Phase PWM Converter; IEEE Conference, Pub. Oct. 2-6, 2005, pp. 410-416.

Funaki, T. et al.; Characterization of SiC JFET for Temperature Dependent Device Modeling; IEEE Conference, Pub. Jun. 18-22, 2006, pp. 1-6.

\* cited by examiner

JFET DEVICES WITH INCREASED BARRIER HEIGHT AND METHODS OF MAKING THE SAME

CROSS-REFERENCE TO RELATED APPLICATION

This application is a divisional of U.S. patent application Ser. No. 12/179,299, which was filed on Jul. 24, 2008, now U.S. Pat. No. 8,120,072, which issued Feb. 21, 2012.

BACKGROUND

1. Field of the Invention

Embodiments of the present invention relate generally to the field of semiconductor devices. More particularly, embodiments of the present invention relate to improved semiconductor devices and techniques for fabricating improved semiconductor devices.

2. Description of the Related Art

Currently, the most commonly used transistor for implementing logic devices in integrated circuits is the metal-oxide semiconductor field effect transistor (MOSFET). In particular, the combination of complementary n-type and p-type MOSFETs, a technology known as "CMOS," allows for the creation of low power logic devices. Because n-MOS and p-MOS devices are connected in series, no drain current flows—except for a small charging current during the switching process between two different states. Furthermore, improved fabrication techniques have, over the years, led to the reduction of MOSFET sizes through a technique known as "scaling," which has led to smaller, more densely packed, and faster chips.

More recently, however, the speed benefits typically associated with scaling have diminished due to fundamental physical constraints inherent in MOSFETs. For example, in order to switch the voltage state of a MOSFET, the MOSFET's gate terminal must be sufficiently charged. The amount of charge that will switch the MOSFET on or off is proportional to the capacitance of the MOSFET's gate terminal. One consequence of scaling is that the thickness of the gate insulator is reduced to maintain acceptably small short-channel effects. Furthermore, to counteract the increased leakage current that may result from the reduced dielectric thickness and thereby keep the gate leakage current below acceptable levels, the gate insulator may be made of a dielectric with a dielectric constant, "k," higher than that of silicon dioxide, whose k equals 3.9. Both the reduced thickness and the higher dielectric constant result in higher capacitance. Therefore, although the maximum drain current may increase for the scaled CMOS device, this benefit is largely limited by the increased capacitance. The result is that although the density of CMOS devices continues to increase, the speed performance of such devices has not increased substantially over the generations.

Junction Field Effect Transistors (JFETs), on the other hand, do not utilize an insulated gate. Rather, in a typical JFET, the gate is p-doped or n-doped semiconductor material and the gate directly contacts the semiconductor body, forming a p-n junction between the gate and the transistor's conductive channel. Because JFETs do not utilize an insulated gate, the total gate capacitance in a JFET may be greatly reduced, which may result in a higher transistor switching speed compared to existing CMOS technology.

However, typical JFETs have limited applicability due to the low forward-bias turn-on voltage, i.e. diode turn-on voltage, of the p-n junction between the gate and the channel of the JFET. In a typical JFET, the depletion region at the gate-channel interface prevents conduction when the gate potential is sufficiently low. To turn on the JFET, the gate potential is raised, which narrows the depletion region, allowing current to flow between the source and the drain. When the gate potential is raised above the forward bias potential of the p-n junction between the gate and the channel (typically 0.6 to 0.7 volts), current then starts to flow from the gate to the drain. This greatly increases the power consumption of the device. There is a limit, therefore, to the voltage that may be applied to a JFET. As a result, typical JFETs may not be suitable in systems or devices which utilize a high voltage relative to the diode turn-on voltage of the JFET.

Therefore, it may be advantageous to provide an improved low-power semiconductor device with reduced gate capacitance and faster switching speed compared to existing CMOS technology. Specifically, it may be advantageous to provide a JFET with improved electrical characteristics that address the limitations discussed above.

DETAILED DESCRIPTION

Embodiments of the present invention relate to JFETs with improved electrical characteristics that address the limitations discussed above, making them more suitable for use in a wide range of semiconductor devices, such as logic devices and memory access devices. Specifically, several embodiments relate to methods and devices for raising the voltage level that may be applied to the gate of a JFET without exceeding the diode turn-on voltage of the p-n junction between the gate and the channel. Several embodiments also relate to systems and devices that include JFETs with improved electrical characteristics.

Figure 1:
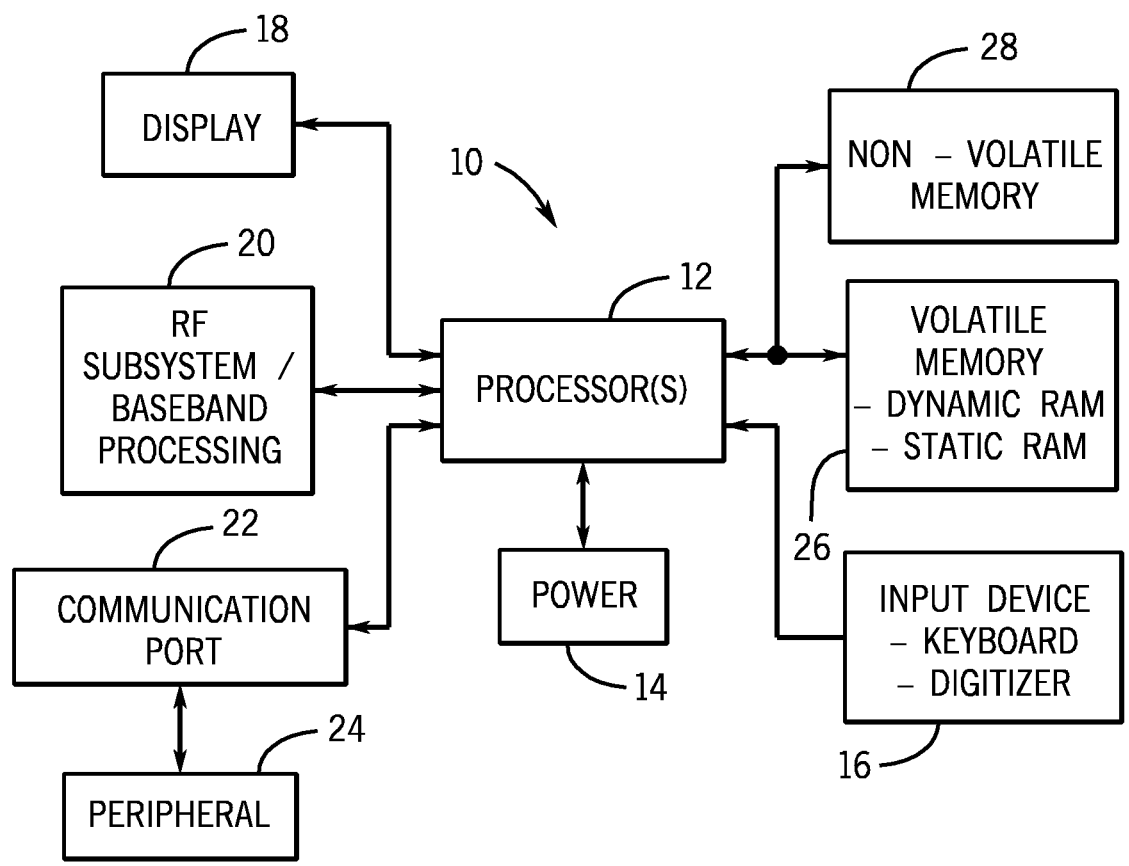
FIG. 1 illustrates a block diagram of a processor-based device in accordance with embodiments of the present invention.

Turning now to the drawings, and referring initially to FIG. 1, a block diagram depicting a processor-based system, generally designated by reference numeral 10, is illustrated. The system 10 may be any of a variety of types such as a computer, pager, cellular phone, personal organizer, control circuit, etc. In a typical processor-based device, one or more processors 12, such as a microprocessor, control the processing of system functions and requests in the system 10. As will be appreciated, the processor 12 may include an embedded North or South bridge (not shown), for coupling each of the aforementioned components thereto. Alternatively, the bridges may include separate bridges coupled between the processor 12 and the various components of the system 10.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

Because the processor 12 generally controls the functioning of the system 10 by implementing software programs, memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 may include a number of memory modules, such as single inline memory modules (SIMMs) or dual inline memory modules (DIMMs). As can be appreciated, the volatile memory 26 may simply be referred to as the "system memory." The volatile memory 26 is typically quite large so that it can store dynamically loaded applications and data.

The processor(s) 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory.

Figure 2:
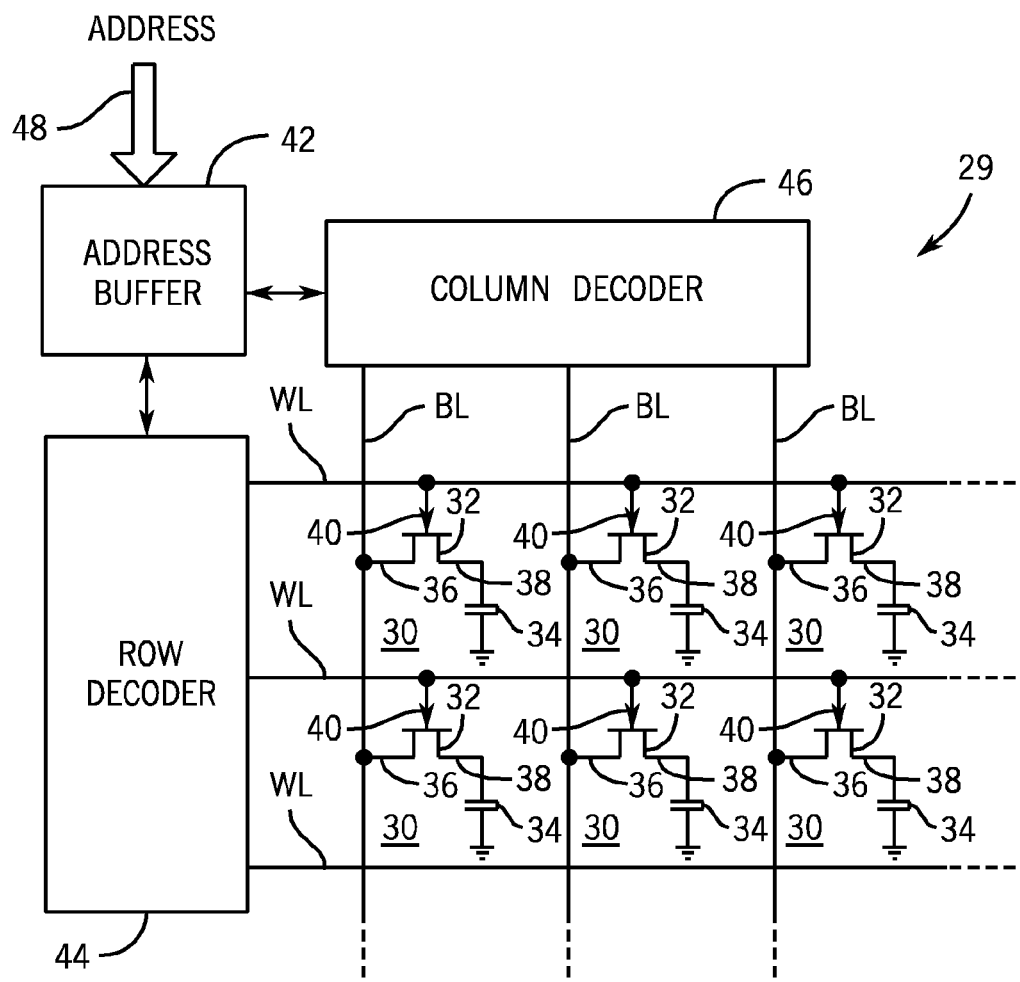
FIG. 2 illustrates a partial schematic illustration of an integrated circuit, incorporating an array of memory cells fabricated in accordance with embodiments of the present invention.
Figure 3:
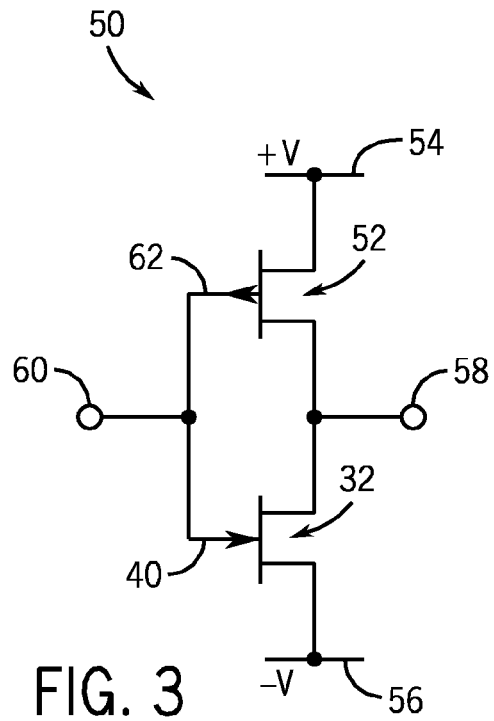
FIGS. 3-5 are circuit schematics of logic devices, incorporating complementary JFET logic devices in accordance with embodiments of the present invention.
Figure 4:
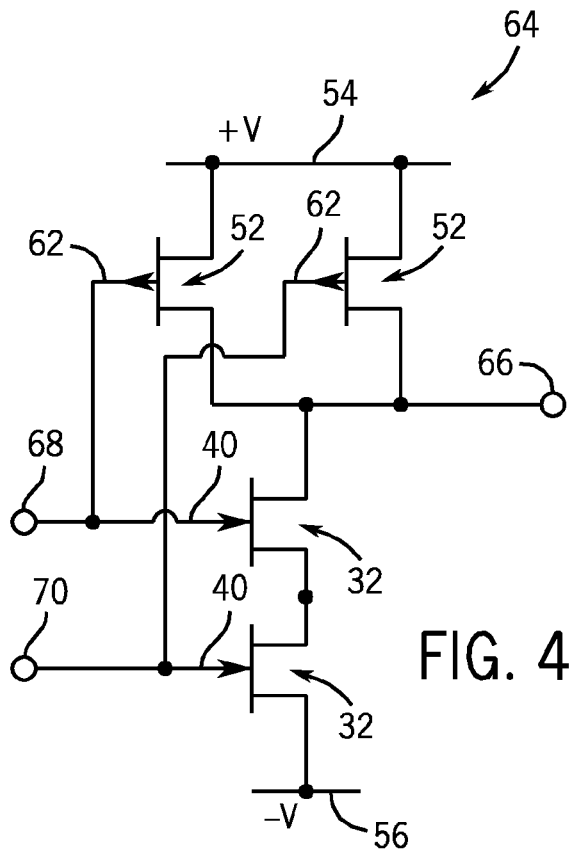
Figure 5:
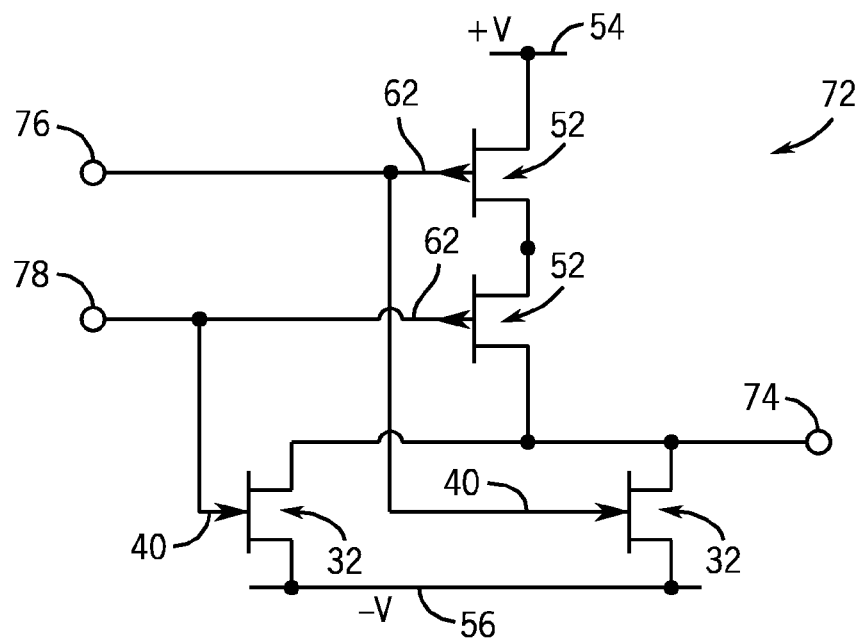

One or more components of the system 10 may include improved JFETs (depicted herein with reference numeral "32" for n-type and "52" for p-type) fabricated in accordance with embodiments described herein. Some examples of devices in which improved JFETs may be beneficial are illustrated in FIGS. 2-5. Specifically, FIG. 2 illustrates a memory device with improved JFETs, and FIGS. 3-5 illustrate integrated circuit logic devices with improved JFETs. FIGS. 6-10 describe the improved JFETs and methods of fabrication.

Referring to now to FIG. 2, a partial schematic illustration of an integrated circuit, such as a memory device 29, which may be implemented in the volatile memory 26, is illustrated. The memory device 29 includes an array of memory cells having transistors which may be fabricated in accordance with the techniques described herein. In some embodiments, the memory device 29 may comprise a dynamic random access memory (DRAM) device. The memory device 29 includes a number of memory cells 30 arranged in a grid pattern and comprising a number of rows and columns. The number of memory cells 30 (and corresponding rows and columns) may vary depending on system requirements and fabrication technology. Each memory cell 30 includes an access device comprising a JFET 32 and a storage device comprising a capacitor 34. The access device is implemented to provide controlled access to the storage device. The JFET 32 includes a drain terminal 36, a source terminal 38, and a gate 40. The capacitor 34 is coupled to the source terminal 38. The terminal of the capacitor 34 that is not coupled to the JFET 32 may be coupled to a ground plane. As described further below, the drain 36 is coupled to a bit line (BL) and the gate 40 is coupled to a word line (WL).

It should be noted that although the above description depicts the terminal of the access device coupled to the capacitor 34 as the "source" 38 and the other non-gate terminal of the access device as the "drain" 36, during read and write operations, the JFET 32 may be operated such that each of the terminals 36 and 38 operates at one time or another as a source or a drain. Accordingly, for purposes of further discussion it should be recognized that whenever a terminal is identified as a "source" or a "drain," it is only for convenience and that in fact during operation of the JFET 32 either terminal could be a source or a drain depending on the manner in which the JFET 32 is being controlled by the voltages applied to the terminals 36, 38 and 40. In addition, it will be appreciated that embodiments of a memory device 29 may include p-type JFETs, n-type JFETS or a combination of both.

As previously described, the memory array is arranged in a series of rows and columns. To implement the data storage capabilities of a memory cell 30, an electrical charge is placed on the drain 36 of the JFET 32 via a bit line (BL). By controlling the voltage at the gate 40 via the word line (WL), the depletion region between the gate 40 and the channel may be narrowed such that the electrical charge at the drain 36 can flow to the capacitor 34. By storing electrical charge in the capacitor 34, the charge may be interpreted as a binary data value in the memory cell 30. For instance, for a single-bit storage device, a positive charge above a known threshold voltage stored in the capacitor 34 may be interpreted as binary "1." If the charge in the capacitor 34 is below the threshold value, a binary value of "0" is said to be stored in the memory cell 30. For reasons discussed above, it will be appreciated that the voltage at the gate 40 may be limited to a voltage sufficiently below the diode turn-on voltage of the JFET's gate-channel junction.

The bit lines BL are used to read and write data to and from the memory cells 30. The word lines WL are used to activate the JFET 32 to access a particular row of a memory cell 30. Accordingly, the memory device 29 also includes a periphery portion which may include an address buffer 42, row decoder 44 and column decoder 46. The row decoder 44 and column decoder 46 selectively access the memory cells 30 in response to address signals that are provided on the address bus 48 during read, write and refresh operations. The address signals are typically provided by an external controller such as a microprocessor or another type of memory controller. The column decoder 46 may also include sense amplifiers and input/output circuitry to further facilitate the transmission of data to and from the memory cell 30 via the bit lines BL.

In one mode of operation, the memory device 29 receives the address of a particular memory cell 30 at the address buffer 42. The address buffer 42 identifies one of the word lines WL of the particular memory cell 30 corresponding to the requested address and passes the address to the row decoder 44. The row decoder 44 selectively activates the particular word line WL to activate the JFET's 32 of each memory cell 30 that is connected to the selected word line WL. The column decoder 46 selects the bit line (or bit lines) BL of the memory cell 30 corresponding to the requested address. For a write operation, data received by the input/output circuitry is coupled to the selected bit line (or bit lines) BL and provides for the charge or discharge of the capacitor 34 of the selected memory cell 30 through the JFET 32. The charge corresponds to binary data, as previously described. For a read operation, data stored in the selected memory cell 30, represented by the charge stored in the capacitor 34, is coupled to the select bit line (or bit lines) BL, amplified by the sense amplifier and a corresponding voltage level is provided to the input/output circuitry in the column decoder 46.

As described below, a memory device 29 that uses improved JFETs in accordance with disclosed embodiments may exhibit superior performance compared to prior art memory devices. For example, memory device 29 may exhibit increased performance due to the increased switching speed of the improved JFETs 32. Furthermore, because the JFET 32 may be activated by a lower voltage, the charge stored on capacitor 34 may also be reduced, which may reduce leakage current of the capacitor 34.

In addition to the memory device 29, improved JFETs 32 may also be used in other parts of the system 10. For example, JFETs fabricated in accordance with the techniques described herein may be used in the processor(s) 12, or any other component of the system 10 that uses integrated circuit logic devices. Referring to FIGS. 3-5, various embodiments of integrated circuit logic devices that include improved JFETs are depicted. Turning first to FIG. 3, an embodiment of a JFET inverter 50 is shown. The JFET inverter 50 includes a p-type JFET 52 and an n-type JFET 32 coupled in series between a high voltage terminal 54 and a low voltage terminal 56. It will be appreciated by a person of ordinary skill in the art that the output terminal 58 will be electrically coupled to the high voltage terminal 54 when the input terminal 60 is low and will be electrically coupled to the low voltage terminal 56 when the input terminal 60 is high.

FIG. 4 depicts an embodiment of a JFET NAND gate 64 is shown. The JFET NAND gate 64 includes two p-type JFETs 52 and two n-type JFETs 32 coupled between a high voltage terminal 54 and a low voltage terminal 56 as shown. It will be appreciated by a person of ordinary skill in the art that the output terminal 66 will be electrically coupled to the high voltage terminal 54 when either of input terminal 68 or 70 is low and will be electrically coupled to the low voltage terminal 56 when both input terminals 68 and 70 are high.

FIG. 5 depicts an embodiment of a JFET NOR gate 72. The JFET NOR gate 72 includes two p-type JFETs 52 and two n-type JFETs 32 coupled between a high voltage terminal 54 and a low voltage terminal 56 as shown. It will be appreciated by a person of ordinary skill in the art that the output terminal 74 will be electrically coupled to the high voltage terminal 54 when both input terminals 76 and 78 are low and will be electrically coupled to the low voltage terminal 56 when either of input terminals 76 or 78 is high.

With regard to the logic devices 50, 64, and 72 discussed above, the voltage level applied to the gates 40 and 62 of the JFETs 32 and 52 may be kept below the diode turn-on voltage of the gate-channel junction to avoid excessive gate-to-drain current and the resulting power dissipation. To increase the voltage that may be applied to the JFET gates 40 and 62 without causing gate-to-drain current, the JFETs 32 and 52 may be fabricated in accordance with one or more embodiments that will be discussed below. It will be appreciated that the integrated circuit logic devices depicted in FIGS. 3-5 are examples only and many other JFET logic devices are possible, utilizing improved JFETs in accordance with disclosed embodiments.

Turning now to FIGS. 6-9, several improved JFETs are depicted in accordance with embodiments of the present invention. Generally, FIGS. 6-9 depict JFETs with improved gate structures that allow the JFET to be coupled to a higher gate voltage without exceeding the diode turn-on voltage of the gate-channel junction. In this way, the improved JFET will be less susceptible to the excessive power loss associated with exceeding the diode turn-on voltage of the gate-channel junction. By improving the performance of the JFET in this way, the improved JFETs may be used in a greater variety of semiconductor devices, as discussed above.

To increase the diode turn-on voltage of the gate-channel junction, embodiments of the present invention generally include manipulating the barrier height of the gate-channel junction. The "barrier height" represents an amount of energy that a charge carrier must obtain to move from one material to another. One of ordinary skill in the art will recognize that the barrier height will depend on the work function and the bandgap of the materials used for the gate and the channel region. Therefore, by choosing materials with the appropriate work function and bandgap values, as will be explained below, the barrier height may be increased, which will increase the diode turn-on voltage of the gate-channel junction.

FIGS. 6-9 generally depict an n-type, i.e. n-channel, JFET 32 in accordance with various embodiments of the present invention. It will be appreciated that an n-type JFET is described for convenience only, and that embodiments of the present invention also include a p-type, i.e. p-channel, JFET. The JFET 32 depicted in FIGS. 6-9 may be fabricated on a semiconductor substrate 79 which may be any semiconductor material, such as silicon. Furthermore, in some embodiments the substrate 79 material may be chosen based on the material's work function. Alternatively, the JFET 32 may also be fabricated over a silicon-on-insulator (SOI) substrate (not shown).

As shown in FIGS. 6-9, the JFET 32 may be fabricated on top of a p-type material 80. Accordingly, the substrate 79 may be a p-type substrate, or, alternatively, p-type material 80 may be formed by creating a p-type well in the substrate 79. The p-type material 80 may also be electrically coupled to the gate terminal 40 via a terminal directly coupled to the p-type material 80 (not shown). Alternatively, in some embodiments, the JFET 32 may not include the underlying p-type material 80.

Above the p-type material 80, the n-type JFET 32 depicted in FIGS. 6-9 may also include a semiconductor material 82, which is n-doped and forms a channel region between the source terminal 36 and the drain terminal 38. In addition, the JFET 32 may include an n-type source region 84 and an n-type drain region 86, which may optionally be heavily doped in order to provide a low resistance between the source and drain electrodes 88 and 90 and the channel region formed in semiconductor material 82. In some embodiments, the JFET 32 may also include lightly doped drain (LDD) regions. Spacer oxides 92 may also be included to separate the source and drain electrodes 88 and 90 from the gate.

Figure 6:
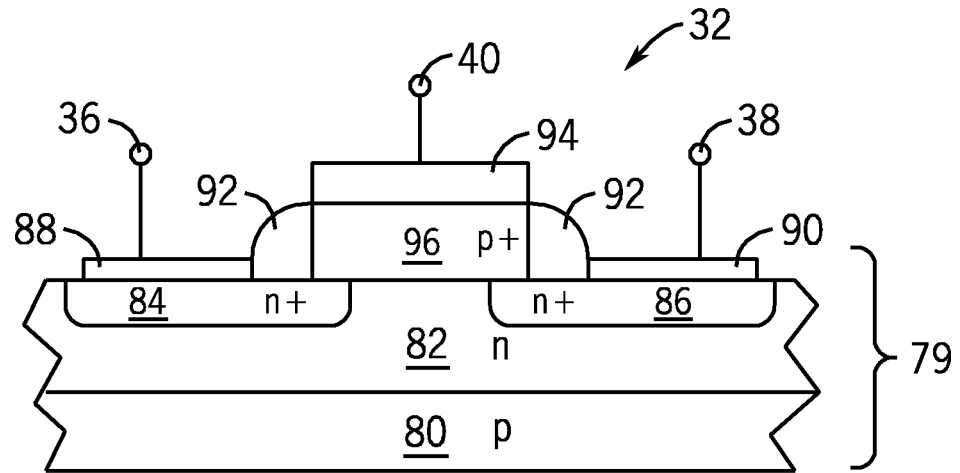
FIGS. 6-9 are cross-sectional views of JFETs with increased barrier height in accordance with one or more embodiments of the present invention.

Referring specifically to FIG. 6, a JFET 32 is depicted in which the barrier height is increased by forming the gate from a silicon carbide material in accordance with embodiments of the present invention. The silicon carbide material 96 may be p-type and may be heavily doped to achieve high conductivity. Additionally, a gate contact 94 may be deposited over the silicon carbide material 96 and coupled to the gate terminal 40. Because silicon carbide exhibits a higher bandgap than silicon (2.86 electron volts compared to 1.11 electron volts for silicon), the barrier height of the gate-channel junction will be increased compared to a device with a silicon gate.

In this way, the diode turn-on voltage of the gate-channel junction may be increased. In some embodiments, the diode turn-on voltage may be increased up to approximately 1.0 to 2.5 volts, 0.5 to 2.0 volts higher than JFETs that use conventional polysilicon gate materials, depending on the polytype of the silicon carbide material. This may allow for the use of n-JFETS and p-JFETS in logic devices and/or memory devices, as shown above, with the advantage of significantly reduced gate capacitance.

Additionally, silicon carbide exhibits a higher maximum drift velocity, higher thermal conductivity and higher breakdown voltage compared to silicon. Therefore, in addition to raising the diode turn-on voltage, the silicon carbide material 96 may also provide enhanced performance characteristics such as higher conductivity, higher current capacity and increased heat dissipation.

Figure 7:
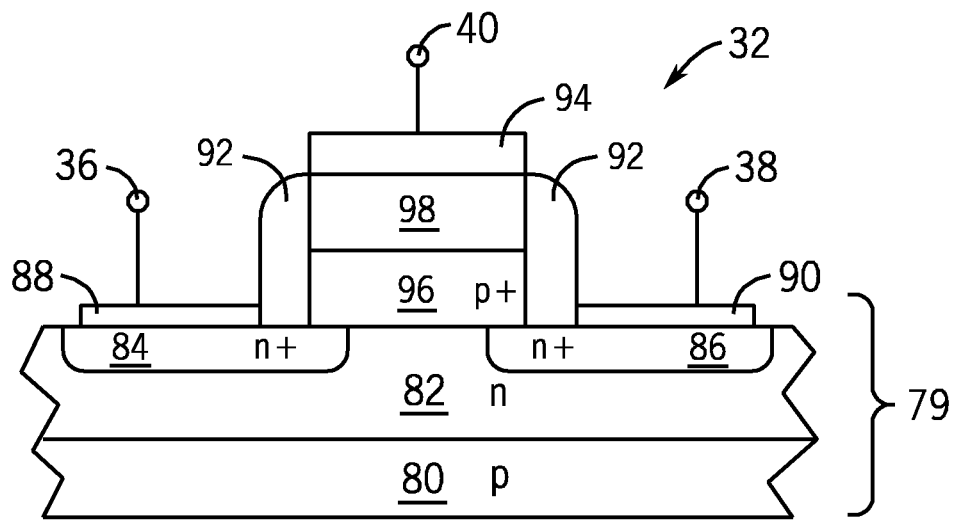

Turning to FIG. 7, a JFET with a gate stack including silicon carbide and silicon germanium carbide (SiGeC) is depicted. The SiGeC material 98 may be formed over the silicon carbide material 96 and may serve as a contact interface between the silicon carbide material 96 and the metal contact 94. Because SiGeC exhibits a lower bandgap than silicon carbide, the SiGeC material 98 may provide better contact characteristics at the interface between the SiGeC material 98 and the metal contact 94, i.e. reduced resistance, compared to the silicon carbide material 96. Furthermore, the mole fraction of germanium may be controlled to manage the work function of the SiGeC material 98 and the resulting contact characteristics, as will be appreciated by a person of ordinary skill in the art.

Figure 8:
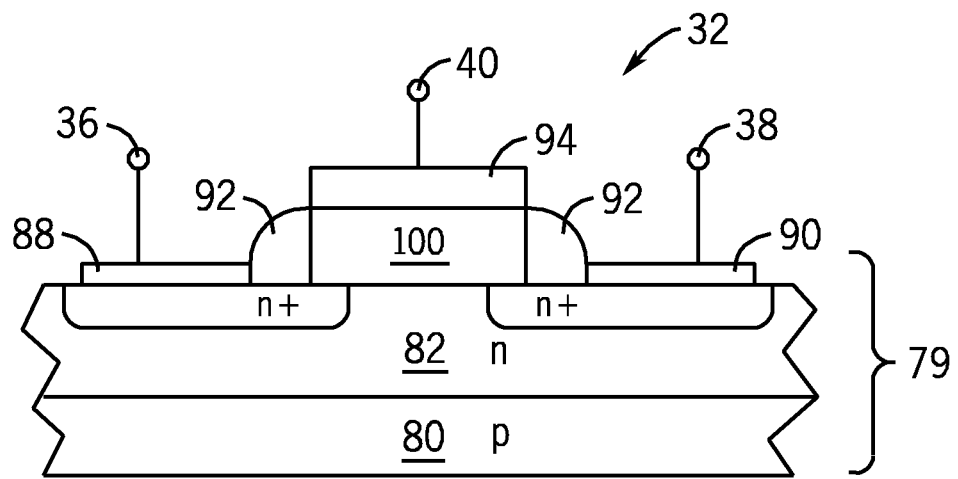
Figure 9:
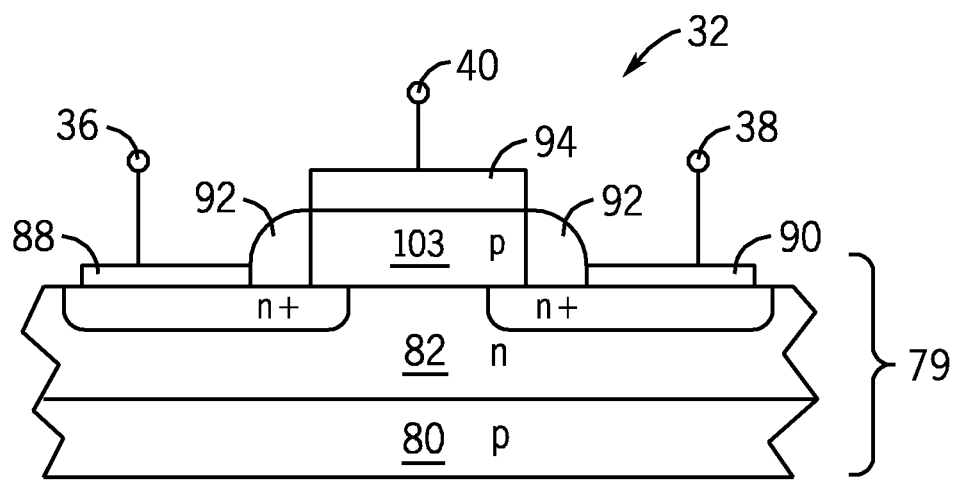

Turning to FIGS. 8 and 9, a JFET 32 with a Schottky barrier is depicted. FIG. 8 depicts a JFET 32 with a Schottky barrier formed at the interface between the channel region and the gate, while FIG. 9 depicts a JFET 32 with a Schottky barrier formed at the interface between the gate and the contact.

In the embodiment shown in FIG. 8, the Schottky barrier is created by forming the gate with a metal or metal silicide. The metal gate 100 may be located directly on the substrate 79 over the channel region. By using a metal gate, a Schottky barrier may be formed between the channel region and the gate, which may result in a JFET with a higher diode turn-on voltage compared to conventional JFETs. The barrier height may be increased by choosing a suitable metal type, substrate type, and substrate doping level. The metal type may be chosen based on the work function of the metal. The work function of a metal represents the amount of energy needed to liberate an electron from the surface of the metal, and will vary with different types of metal. For example, low work functions metals such as magnesium and hafnium exhibit work functions of 3.66 and 3.9 electron volts, respectively, and high work function metals like platinum and gold exhibit work functions of 5.65 and 5.1 electron volts, respectively.

For an n-doped channel, the barrier height may be increased by choosing a metal with a high work function such as palladium, platinum, gold, nickel, or a silicide of such metals, for example. In some embodiments, the work function of the metal may be greater than 4.5 electron volts. The barrier height may be further increased for the n-type channel by lightly doping the channel region. For example, the channel region may be doped in the range of approximately 5.0e15 to 1.0e16 atoms per cubic centimeter or lower. Furthermore, a high Schottky barrier may be formed by leaving the channel region undoped, or intrinsic.

For a p-doped channel, the barrier height may be increased by choosing a metal with a low work function, such as magnesium, tantalum, aluminum, or hafnium or a silicide of such metals, for example. In some embodiments, the work function of the metal may be less than 4.5 electron volts. The barrier height may be further increased for the p-type channel by lightly doping the p-type channel region. For example, the channel region may be doped in the range of approximately 5.0e15 to 1.0e16 atoms per cubic centimeter or lower. Additionally, the channel region may also be undoped, or intrinsic. Furthermore, for a p-doped channel, the barrier height may also be increased by forming the substrate 79 of a semiconductor material with a high bandgap, such as silicon carbide.

In the embodiment shown in FIG. 9, the gate includes a doped semiconductor material 103, and the metal contact 94 is formed over the semiconductor material 103. By choosing an appropriate metal, a Schottky barrier may be formed between the semiconductor material 103 and the contact 94, i.e. between the gate and the contact. For an n-doped gate material, the barrier height of the gate-contact junction may be increased by choosing a metal with a high work function, as explained above in relation to FIG. 8. Similarly, for a p-doped gate material, the barrier height may be increased by choosing a metal with a low work function. Furthermore, for a p-doped or n-doped gate material, the barrier height may also be increased by forming the semiconductor material 103 from a semiconductor material with a high bandgap, as described in relation to FIG. 6.

Figure 10:
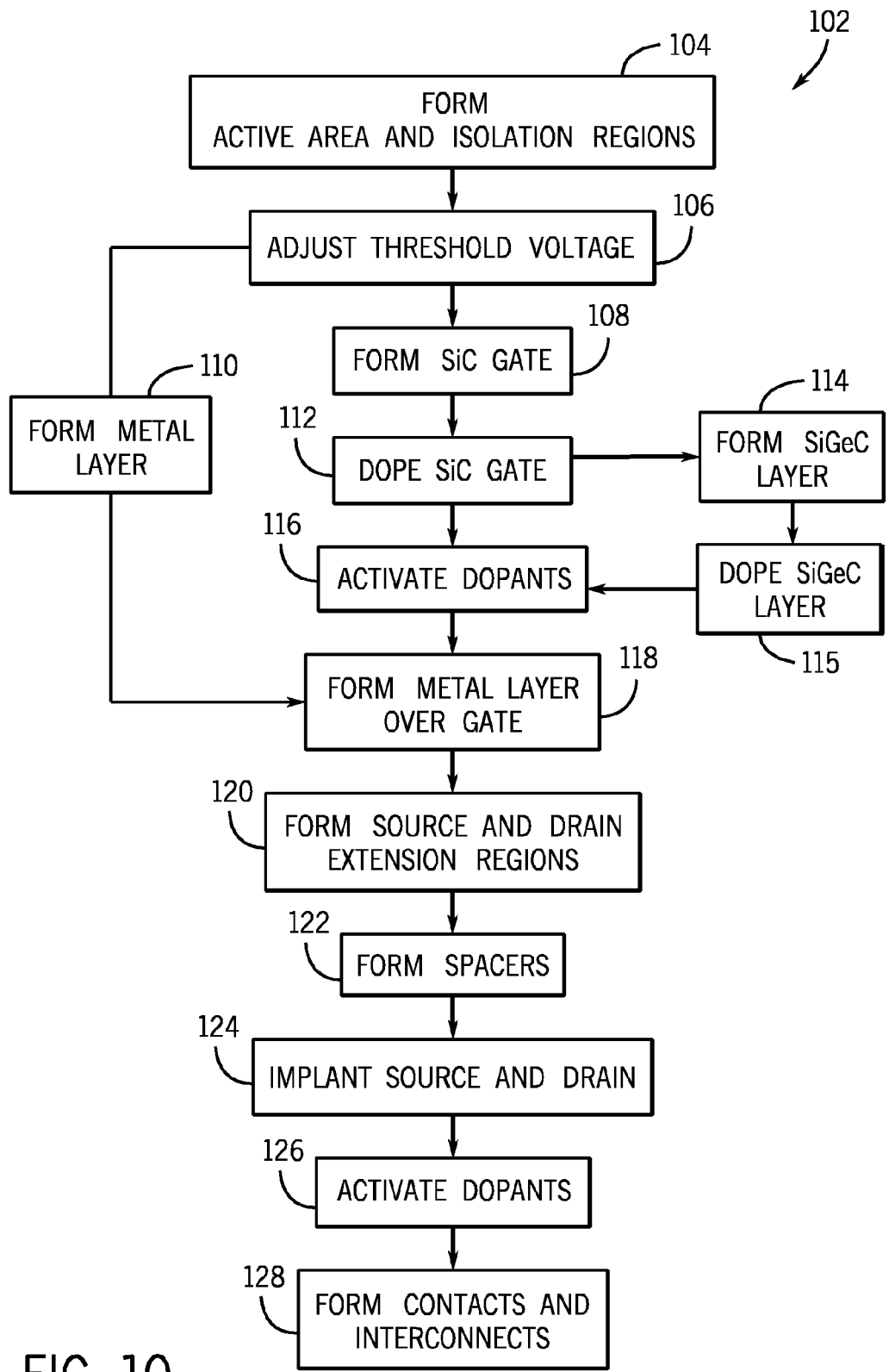
FIG. 10 is a flow chart depicting processes for fabricating JFETs with increased barrier height in accordance with one or more embodiments of the present invention.

Turning now to FIG. 10, a process for fabricating an improved JFET 32 in accordance with embodiments of the present invention is shown. The process 102 may be used to fabricate individual JFETs, JFET arrays, or complementary JFET devices such as those described in relation to FIGS. 2-5. The process 102 depicts methods of fabricating the three separate embodiments depicted in FIGS. 6-9. Specifically, a method for fabricating a silicon carbide gate as shown in FIG. 6 is represented in steps 108, 112, and 116, a method for fabricating a silicon carbide gate with an added SiGeC material 98 as shown in FIG. 7 is represented with the addition of steps 114 and 115, and a method of fabricating a metal gate as shown in FIG. 8 is represented in step 110.

The process 102 starts with a bulk substrate 79 or silicon-on-insulator (SOI) substrate, which is processed at step 104 to form an active area and isolation regions using conventional lithography, oxidation and dopant implantation processes. At step 104, p-doped and/or n-doped wells may be formed for the creation of n-type and/or p-type JFETs, respectively. In addition, a triple well may optionally be formed to provide increased isolation for the JFET device.

Next at step 106, the threshold voltage of the device is adjusted by doping the active region of the JFET in accordance with techniques known to those of ordinary skill in the art. After adjusting the threshold voltage at step 106, the process 102 may advance to step 108 or 110, depending on the particular gate material to be used. If a silicon carbide material 96 is to be deposited, process 102 will advance to step 108. If, instead of a silicon carbide material, a metal gate 100 is to be deposited, as shown in FIG. 8, process 102 will advance to step 110, skipping steps 108, 112, 114, 115 and 116.

At step 108, silicon carbide material 96 is deposited to form a JFET with a silicon carbide gate in accordance with the embodiments shown in FIGS. 6 and 7. The silicon carbide may be of any polytype including 4H-SiC or 6H-SiC, for example, and may be deposited on top of the substrate 79 by chemical vapor deposition (CVD). Alternatively, carbon may be implanted in a shallow layer on the top surface of the substrate 79. For example, carbon may be implanted with an implant energy of less than approximately 5 keV, and a dosage of approximately 1e14 to 1e15 atoms per square centimeter. After doping the substrate 79 with carbon, silicon carbide may be grown epitaxially over the carbon doped region via atomic layer deposition (ALD) to a thickness of approximately 500 to 1500 angstroms.

Next, at step 112, the silicon carbide material 96 is doped (p-type or n-type) depending on the type of JFET being fabricated. For an n-type JFET, the silicon carbide material 96 may be p-doped with a suitable p-type dopant such as aluminum or boron. For a p-type JFET, the silicon carbide material 96 may be n-doped with a suitable n-type dopant such as arsenic or phosphorous. The dopants may be implanted using an implant energy of approximately 10 to 50 keV, depending on the gate thickness, and a dosage of approximately 5e14 to 5e15 atoms per cubic centimeter.

After step 112, process 102 may advance to step 114 or 116 depending on whether a SiGeC material 98 will be formed over the silicon carbide material 96. At step 114, a SiGeC material 98 may be formed over the silicon carbide material 96 as shown in FIG. 7. The SiGeC material 98 may be deposited over the silicon carbide material 96 by CVD or may be grown epitaxially via ALD. The SiGeC material 98 may be formed to a thickness of approximately 50 to 200 angstroms. Next, at step 115, the SiGeC material 98 may be doped to a level in the range 1.0e18 to 1.0e20 atoms per cubic centimeter.

Next, at step 116, the gate dopants are activated by annealing at a temperature in the range of 800 to 1100 degrees Celcius. The time for the anneal may be approximately 30 minutes for a furnace anneal or approximately two seconds for a spike anneal.

If, instead of the silicon carbide material 96, a metal gate 100 is to be deposited, as shown in FIG. 8, the process 102 will advance from step 106 to step 110. At step 110, a metal gate 100 is deposited directly on the substrate 79 by any method known in the art for depositing metal on semiconductor, such as CVD, physical vapor deposition (PVD), or sputtering for example. In one or more embodiments, the metal gate 100 may be a metal silicide formed by growing or depositing polysilicon directly on the substrate 79 by CVD or low pressure CVD and doping the polysilicon through a process such as diffusion doping or ion implantation.

After finishing one of the three alternative step sequences described above, the gate structure will be substantially completed after patterning the gate. The process 102 will then advance to step 118, in which a metal is formed over the gate with a thickness of approximately 200 to 1000 angstroms to form the gate contact 94. The gate contact 94 may include any suitable metal, such as tungsten, nickel, titanium, tantalum, or cobalt, and may be formed by any method known in the art for depositing metal on semiconductor, such as CVD, physical vapor deposition (PVD), or sputtering for example. In one or more embodiments, the gate contact 94 may include a metal silicide, such as tungsten silicide, nickel silicide, titanium silicide, tantalum silicide, or cobalt silicide, and may be formed by growing or depositing polysilicon directly on the substrate 79 by CVD or low pressure CVD and doping the polysilicon through a process such as diffusion doping or ion implantation. The gate contact 94 may be patterned using known photolithography techniques and formed using known etching techniques. In some embodiments, such as when the gate itself is metal, the step of forming a gate contact 94 over the gate may be eliminated.

Next, at step 120 the source and drain regions are formed using a technique such as gate-self-aligned implantation to create source and drain extension regions known as lightly-doped-drain (LDD) regions. The source and drain regions may be doped with any suitable dopants, such as boron, BF$_2$, or indium for p-type doping, or arsenic, phosphorous, or antimony for n-type doping. Dopants may be implanted with a dose in the range of 1e13 to 1e15 atoms per cubic centimeter and an implant energy in the range of 5 to 30 keV. In some embodiments, the implantation may optionally be accomplished through plasma assisted doping (PLAD).

Next, at step 122, the spacers 92 may be formed. To form the spacers 92 an oxide, nitride or other dielectric material or combination of materials may be formed over the top and sides of the gate stack. After depositing the spacer material, the spacers 92 are formed on the sides of the gate to a thickness of approximately 100 to 500 angstroms using photolithography and etching techniques known in the art.

Next, at step 124 the source and drain regions 84 and 86 may be implanted to form heavily doped n+ or p+ source and drain regions. The source and drain regions may be doped with any suitable dopants, such as boron, BF$_2$, or decaborane for p-type doping, or arsenic or phosphorous for n-type doping. Dopants may be implanted with a dose in the range of 1e15 to 1e16 atoms per cubic centimeter and an implant energy in the range of 0.5 to 10 keV.

Next, at step 126 the dopants implanted in previous steps are activated. First, a dielectric material, such as an oxide, nitride or combination is deposited to cap the active area. Then, the dopants are activated by a rapid thermal anneal or laser anneal. For example, the anneal may occur at 1000 to 1100 degrees Celsius and last for 2 to 10 seconds.

Finally at step 128, all of the remaining contacts and interconnects may be formed in accordance with processes that are well known in the art. Those of ordinary skill in the art will recognize process variations that may be implemented while still remaining within the scope of the present invention.

Those of ordinary skill in the art will recognize the advantages of forming a JFET in accordance with the process described above. Specifically, by manipulating the barrier height between the channel and the gate, diode turn-on voltage of the JFET may be increased. Therefore, unlike prior art, the presently described embodiments may operate under a larger operating voltage compared to conventional JFETs while still maintaining a low gate current. Consequently, this may allow the use of JFETs in a wider range of electronic devices, such as logic devices and memory storage devices such as those described above.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A transistor, comprising:
a semiconductor substrate comprising a source region and a drain region;
a channel formed in the semiconductor substrate between the source region and the drain region, the channel configured to pass current between the source region and the drain region, wherein the channel is doped to a concentration of less than 1.0e16 atoms per cubic centimeter or the channel is undoped or intrinsic; and
a gate comprising a metal formed directly on a top surface of the semiconductor substrate over the channel;
wherein a Schottky barrier is formed between the gate and the channel; and
wherein:
the channel is n-type and the metal comprises palladium, nickel, tungsten, or molybdenum, or a silicide of palladium, nickel, tungsten, or molybdenum; Or
the channel is p-type and the metal comprises magnesium, tantalum, hathium, or a silicide of magnesium, tantalum, or hafnium; or the channel is undoped or intrinsic and the metal comprises palladium, nickel, magnesium, tantalum, hafnium, tungsten, or molybdenum, or a silicide of any of these.

2. The transistor of claim 1, wherein the channel is undoped or intrinsic.

3. The transistor of claim 1, wherein the channel is p-type and the semiconductor substrate comprises silicon carbide.

4. The transistor of claim 1, wherein the metal exhibits a work function less than approximately 4.5 electron volts.

5. The transistor of claim 1, wherein the channel comprises a semiconductor material with a bandgap greater than approximately 2.0 electron volts.

6. The transistor of claim 1, wherein the channel comprises silicon carbide.

7. The transistor of claim 1, wherein the metal gate comprises a metal silicide.

8. A method of fabricating a transistor, comprising
providing a channel in a semiconductor substrate, wherein the channel is undoped or intrinsic; and
forming a metal gate directly on top of the channel;
wherein the bandgap of the semiconductor substrate and the work function of the metal are selected to form a Schottky barrier.

9. The method of claim 8, wherein forming the metal gate comprises forming a metal gate comprising magnesium, hafnium, tantalum, tungsten, molybdenum, or nickel, or a silicide of magnesium, hafnium, tantalum, tungsten, molybdenum, or nickel.

10. The method of claim 8, wherein the semiconductor substrate comprises silicon carbide.

11. The method of claim 8, comprising forming a metal contact directly on top of the metal gate.

12. A transistor, comprising:
a semiconductor substrate comprising a source region and a drain region;
a channel formed in the semiconductor substrate between the source region and the drain region, the channel configured to pass current between the source region and the drain region, wherein the channel comprises a channel material that is doped to a concentration of less than 1.0e16 atoms per cubic centimeter or is undoped or intrinsic; and
a gate formed directly on a top surface of the semiconductor substrate over the channel, the gate comprising a gate material;
wherein a bandgap of the gate material is higher than a bandgap of the channel material; and
wherein:
the channel is n-type and the gate material comprises palladium, nickel, tungsten, or molybdenum, or a silicide of palladium, nickel, tungsten, or molybdenum; or
the channel is p-type and the gate material comprises magnesium, tantalum, hafnium, or a silicide of magnesium, tantalum, or hafnium; or
the channel is undoped or intrinsic and the gate material comprises palladium, nickel, magnesium, tantalum, hafnium, tungsten, or molybdenum, or a silicide of any of these.

13. The transistor of claim 12, wherein the channel material is an n-type material and the metal exhibits a work function greater than approximately 4.5 electron volts.

14. The transistor of claim 12, wherein the channel material is a p-type material and the metal exhibits a work function less than approximately 4.5 electron volts.

15. The transistor of claim 12, comprising a lower substrate beneath the semiconductor substrate, wherein the channel of the semiconductor substrate is n-type and the lower substrate is p-type, and wherein the gate is electrically connected to the lower substrate.

16. The transistor of claim 12, comprising a lower substrate beneath the semiconductor substrate, wherein the channel of the semiconductor substrate is p-type and the lower substrate is n-type, and wherein the gate is electrically connected to the lower substrate.

17. The transistor of claim 14, wherein the channel material comprises a semiconductor material with a bandgap greater than approximately 2.0 electron volts.

* * * * *